United States Patent
Döpper

(10) Patent No.: US 6,602,542 B2
(45) Date of Patent: Aug. 5, 2003

(54) DEVICE FOR CLEANING AN ARTICLE

(75) Inventor: Gebhard Döpper, Aachen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/045,770

(22) Filed: Jan. 10, 2002

(65) Prior Publication Data

US 2002/0063114 A1 May 30, 2002

Related U.S. Application Data

(62) Division of application No. 09/840,552, filed on Apr. 23, 2001, which is a continuation of application No. PCT/EP99/07997, filed on Oct. 21, 1999.

(30) Foreign Application Priority Data

Oct. 21, 1998 (EP) .............................................. 98119920

(51) Int. Cl.[7] ................................................ B23K 9/00
(52) U.S. Cl. ............................................... 427/121.43
(58) Field of Search ....................... 219/121.43, 121.52, 219/121.58, 121.54, 121.12, 121.2, 121.21; 204/298.21, 298.41, 192.38; 228/246

(56) References Cited

U.S. PATENT DOCUMENTS

| | | | | |
|---|---|---|---|---|
| 3,763,346 A | * | 10/1973 | Drechsler et al. ...... 219/121.21 |
| 4,116,791 A | * | 9/1978 | Zega et al. ................... 204/298 |
| 4,446,373 A | * | 5/1984 | Denholm et al. ......... 250/492.2 |
| 4,500,564 A | | 2/1985 | Enomoto |
| 5,087,477 A | | 2/1992 | Giggins, Jr. et al. |
| 5,193,736 A | * | 3/1993 | Marijnissen et al. ......... 228/119 |
| 5,238,752 A | | 8/1993 | Duderstadt et al. |
| 5,459,296 A | * | 10/1995 | Sermund ................ 219/121.02 |
| 6,036,828 A | * | 3/2000 | Beers et al. ............ 204/298.41 |

FOREIGN PATENT DOCUMENTS

| | | |
|---|---|---|
| DE | 42 28 499 C1 | 10/1993 |
| DE | 195 00 262 C1 | 9/1995 |
| GB | 1 447 754 | 9/1976 |
| GB | 2 323 855 | 10/1998 |
| JP | 60-077970 | 5/1985 |
| WO | WO 98/13531 | 4/1998 |

\* cited by examiner

Primary Examiner—Mark Paschall
(74) Attorney, Agent, or Firm—Laurence A. Greenberg; Werner H. Stemer; Ralph E. Locher

(57) ABSTRACT

The surface of an article with a metallic base body is cleaned. A plasma comprising electrically positively charged ions is generated, and the ions are accelerated toward the article, so that they come into contact with the base body for cleaning purposes. To do this, an electron beam is directed onto the base body. The outgoing flux of electrons which come into contact with the base body is controlled by the base body being connected to a reference potential via a switch of at a fixed, adjustable or regulated frequency.

7 Claims, 3 Drawing Sheets

DEVICE FOR CLEANING AN ARTICLE

CROSS-REFERENCE TO RELATED APPLICATION

This is a division of U.S. application Ser. No. 09/840,552, filed Apr. 23, 2001 which was a continuation of copending International Application PCT/EP99/07997, filed Oct. 21, 1999, which designated the United States.

BACKGROUND OF THE INVENTION

Field of the Invention

The invention relates to a device for cleaning a product which has a substrate chamber in which there is a substrate guide and which has a substrate holder.

U.S. Pat. No. 5,238,752 describes a thermal barrier coating system with an intermetallic bond coat. The thermal barrier coating system is applied to a metallic base body, in particular to a Cr—Co-steel for an aircraft engine blade. An intermetallic bond coat, in particular of nickel aluminide or a platinum aluminide, is applied directly to this metallic base body. This bond coat is adjoined by a thin ceramic layer of aluminum oxide, to which the actual thermal barrier coating, in particular of yttrium stabilized zirconium oxide, is applied. This ceramic thermal barrier coating of zirconium oxide has a rod-like structure, the rod-like columns being oriented substantially perpendicular to the surface of the base body. The intention of this is to improve the ability to withstand cyclic thermal loads. The thermal barrier coating is deposited on the base body by means of an electron beam PVD (Physical Vapor Deposition) process, zirconium oxide being vaporized from a metal oxide body by an electron beam gun. The process is carried out in a corresponding device, in which the base body is preheated to a temperature of approximately 950° C. to 1000° C. During the coating operation, the base body is rotated at a constant rate in the jet comprising the metal oxide.

An electron beam PVD process for producing a ceramic coating is also described in U.S. Pat. No. 5,087,477. The ceramic coating produced in this case has a layer thickness of between 250 and 375 µm.

To provide good adhesion between the coating and the base body, it is advantageous for the base body to be cleaned prior to the coating operation. It has become known from British patent specifications GB 2 323 855 and GB 1 447 754 to clean a product which is to be coated prior to the coating. The cleaning in those cases takes place by means of a sputtering process, in which firstly a plasma is generated and the positive ions of the plasma are accelerated toward the base body. The device for cleaning the base body is integrated in the device for coating the base body. In order for the base body to be heated to a suitable coating temperature, the base body is heated with the aid of an electron beam. There is provision for it to be possible to switch between the heating phase by means of the electron beam and the cleaning phase by means of ion sputtering. To do this, it is necessary for the relationship of potential between the base body and the electron source or the positive ions of the plasma to be adjusted or controlled. To do this, GB 2 323 855 provides for the base body to be connected to a voltage source, in order to set the base body to a suitable potential. In GB 1 447 754, a voltage source and a monitoring device are also provided, in order to be able to influence the relationships of potential between base body, electron source and plasma. Therefore, to set a suitable relationship of potential, according to both literature sources an active voltage supply is required.

SUMMARY OF THE INVENTION

The object of the present invention is to provide a device for cleaning an article.

With the above and other objects in view there is provided, in accordance with the invention, a method of cleaning a surface of an article having a metallic base body, the method which comprises:

generating a plasma with electrically positively charged ions, accelerating the ions towards the article, and bringing ions into contact with the base body for cleaning the base body;

directing an electron beam onto the base body; and controlling an outgoing flow of electrons coming into contact with the base body by connecting the base body to a reference potential via a switch at a given frequency, which may be fixed preset, adjustable, or regulated.

In other words, the object relating to a process for cleaning the surface of a product which has a metallic base body is achieved by the fact that a plasma with electrically positively charged ions is generated and the ions are accelerated toward the product, so that they come into contact with the base body for cleaning purposes, an electron beam being directed onto the base body, and that the outgoing flux of electrons which come into contact with the base body is controlled as a result of the base body being connected to a reference potential via the switch with a fixedly preset, adjustable or regulated frequency.

With this process, the surface of the product, in particular a component in a plasma, undergoes preliminary cleaning in such a manner that the adhesion of layers which are to be vapor-deposited is significantly improved compared to a process involving thermal cleaning. The latter may, for example, lead to gases escaping.

Compared to the processes which are known from the prior art, the process described here has the crucial advantage of being significantly simpler and therefore also less susceptible to faults.

This is primarily due to the fact that the connection of the base body to the reference potential which is, for example, frame potential or ground potential, can be switched on and off makes it easy to suitably adjust the relationship of potential between base body and plasma and the electrons of the electron beam. Therefore, the electrical potential of the base body is controlled by means of the connection to the reference potential. The outgoing flux can in this case be controlled between a maximum value and a minimum value, the minimum value preferably being zero, i.e. there is no outgoing flux of electrons. In the latter case, the electrons do not flow out and an electron build-up is produced around the product, which negatively charges the product. In the presence of the plasma, the positively charged ions are accelerated toward the product; they come into contact with the product at a parameter-dependent velocity. Contaminants present on the surface of the product are removed by means of a pulse exchange with this surface.

On the other hand, if the outgoing flux is set to a maximum value, i.e. the switch is closed and the base body is connected to the reference potential, for example, frame potential, the electrons can flow out of the electron beam without obstacle. Consequently the positive ions of the plasma are not accelerated toward the base body. Therefore, when the switch is closed, the product is substantially only exposed to the electron beam, which heats the product. Therefore, by actuating the switch it is simple to switch over between a cleaning phase and a heating phase. The switch can be suitably actuated with a fixedly preset, adjustable or regulated frequency.

The outgoing flux of electrons preferably takes place via an electrical outgoing line, which is alternately opened and closed by means of the switch. This outgoing line produces a current path which is constantly switched between passing and blocking. The alternating switching between passing and blocking of the current path can take place at a constant, possibly temporally variable frequency. Alternating switching allows alternating charging and discharging of the product, as a result of which, in the presence of a gas, an alternating voltage discharge (plasma) can be ignited or maintained. In this way, it is possible to continuously clean the component.

The frequency at which the outgoing flux of electrons is controlled may in this case lie between a few hertz and frequencies up to the megahertz range, in particular, the frequency may be approximately 50 kHz or approximately 27 MHz. The high-frequency switching has the crucial advantage that, at suitable high frequencies, the cleaning effect is not dependent upon the component geometry. Therefore, the high-frequency switching allows reliable and in particular homogenous cleaning of the product.

There is a potential difference, i.e. an electric voltage, between the plasma and the base body, which potential difference can be influenced, in particular, set, by suitably controlling the outgoing flux of electrons from the base body. This potential difference produces a bias voltage in a range from approximately 100 V to approximately 1000 V. This bias voltage may be selected in such a way that the formation of the plasma, in particular as a result of an alternating voltage discharge, can be ignited and maintained.

Preferably the bias voltage between the electrically positively charged ions of the plasma and the base body is determined and, if appropriate, can be used to control the outgoing flux of the electrons. It is thus also possible to carry out a regulating process between bias voltage and outgoing flux of the electrons with the view to achieving the most expedient cleaning of the product possible depending on the type of metallic base body (geometric shape, metallurgical composition, etc.). The bias voltage is in this case measured and displayed as a temporal mean.

In accordance with an added feature of the invention, the plasma is generated by an electron beam, in particular by the electron beam which is directed onto the base body and can also be used, inter alia, to heat the product. The electron beam may in this case be of fan-shaped or cone-shaped design as an electron beam fan or cone, in order to be able to irradiate a large area of the base body and to be able to generate a sufficiently large volume of plasma. It is also possible for the plasma to be generated in a separate process and for the plasma which has already been ionized to be passed into the vicinity of the product. The gas from which the plasma is formed is preferably an inert gas, in particular a noble gas, such as argon. This ensures that no undesirable chemical reactions take place on the surface of the product, in particular the base body, but rather the product is simply cleaned. As an alternative, it is also possible to use a reactive gas, in particular hydrogen, to form the plasma.

When using hydrogen, the plasma is also able to remove oxide on the product by means of oxidation to form water.

The product is preferably rotated about an axis of rotation during the cleaning in which positively charged ions come into contact with the product. The result is uniform cleaning and heating of the product even in the event of complex geometries.

To enable the cleaning to be carried out as quickly and effectively as possible, in a particularly advantageous embodiment, the product is heated before the cleaning operation. The heating causes a large proportion of the contaminants on the surface and in the product to vaporize or gasify. The gasification of contaminants situated in the body of the product is in this context particularly advantageous with a view to the properties of the component. As a result, the cleaning phase by means of ion firing (sputtering) which follows this thermal cleaning phase becomes more effective. Therefore, preheating of the product prior to the sputtering is of considerable significance primarily from an economic viewpoint, not least because of the time saved. This embodiment with preheating is not restricted to the configuration with an outgoing flux of electrons passing via a switch to the reference potential, for example frame potential. Rather, it is independent of the particular way in which the potential level of the product is set.

During the cleaning, the product is preferably simultaneously heated to a temperature which is greater than or equal to the coating temperature, which in particular lies above 800° C. Heating to a temperature above the coating temperature has the beneficial effect that there is relatively little evolution of gases during the subsequent coating at a lower temperature. This heating can be achieved by means of the electron beam, which simultaneously serves to generate a controllable negative potential of the base body.

The process for cleaning and, if appropriate, simultaneously heating the product is preferably integrated in a process for coating the product with a protective layer, in particular a thermal barrier coating. According to the invention, the second object, relating to a process for coating a product, is therefore achieved by the fact that the product undergoes prior cleaning by a plasma, in the manner described above, prior to the actual coating process.

The process for producing a thermal barrier coating is preferably carried out as an electron beam physical vapor deposition (EB-PVD) process or as a reactive gas flow sputtering process as described, for example, in international PCT publication WO 98/13531 A1.

Within the context of the overall coating process, the product has preferably already been preheated prior to the cleaning, to a temperature which in particular is higher than the actual coating temperature of the product, which is over 800° C. As has already been stated, this increases the effectiveness of the cleaning by means of ion sputtering. The heating takes place, for example, with the aid of the electron beam and/or a further heating device. After the cleaning, the product is heated to the coating temperature; this is also to be understood as meaning that heating to the coating temperature has already taken place during the cleaning, so that after the cleaning the product is at the coating temperature. Preferably, preheating, cleaning and coating immediately follow one another, in which case the preheating already produces an initial cleaning action and in which case during the actual cleaning it is possible to switch between sputtering mode and heating phase (by means of electron firing). The fact that the three processes of preheating, cleaning and coating immediately follow one another ensures that the product is always held at a sufficiently high temperature level.

In accordance with an additional feature of the invention, the actual cleaning process is carried out in a chamber, referred to below as the substrate chamber. This may be a preheating chamber of a coating installation, the actual coating chamber itself, or a separate chamber which is designed specifically for the cleaning. To generate the electron beam which is used to electrically charge the base body, it is possible to use an electron beam gun, which is likewise used to carry out the coating process or is accordingly designed only for cleaning or heating. An electron beam gun of this type may have an electron beam capacity of up to 150 kW with an acceleration voltage of up to 35 kV.

With the above and other objects in view there is also provided, in accordance with the invention, a device for cleaning an article, comprising:

a housing defining a substrate chamber;

a substrate guide disposed in said substrate chamber;

a substrate holder for holding an article connected to said substrate guide in a mechanically fixed and electrically insulated manner;

an electrical outgoing line connected to said substrate holder, and a switch connected in said electrical outgoing line for selectively connecting said substrate holder to a reference potential; and an electron beam gun for generating an electron beam directed onto the article.

In other words, the object relating to a device for cleaning a product, in particular a component of a gas turbine, is achieved by a device which has a substrate chamber in which a substrate guide with a substrate holder for holding the product is provided, the substrate guide being connected in a mechanically fixed but electrically insulated manner to the substrate holder, and it being possible to connect the substrate holder to reference potential via an outgoing line and by means of a switch arranged in the outgoing line. The reference potential may in this case, for example, be frame potential or ground potential.

In accordance with another feature of the invention, the switch is connected to a control device for controlling the alternating opening and closing of the switch. This makes it possible to actuate the switch with a fixedly preset, adjustable or regulated frequency. The substrate chamber may in this case be the actual coating chamber of a coating installation, a preheating chamber of a coating installation or a separate chamber.

The outgoing line is preferably connected to a current- and/or voltage-measuring device, so that the electron current passing through the outgoing line and a bias voltage between the base body and a plasma which is present in the substrate chamber can be measured. The plasma itself is preferably generated by firing an electron beam from a electron beam gun onto the base body. The electron beam gun may in this case be arranged inside the substrate chamber or outside this chamber and may be specifically designed for firing the base body, for example for heating purposes. It is also possible to use an electron beam gun which is used to fire at a coating target in order to produce a coating on the base body. The current- and/or voltage-measuring device is preferably connected to the control device.

Furthermore, to regulate the switching frequency of the switch, it is preferable to provide a regulator for which a desired value is preset. A desired frequency value for the regulator may in this case be established, for example, by means of a desired current value and/or a desired voltage value.

Preferably, the substrate chamber is a coating chamber of a coating installation and the substrate holder and the substrate guide, after cleaning of the product, also simultaneously serve to hold the product during the coating with a protective layer, in particular a thermal barrier coating. During the cleaning, the product is held in the substrate holder, which is electrically insulated with respect to the substrate guide, which serves as the anode. Together with the outgoing line, the substrate holder forms a current path which is controllable, i.e. switchable. The substrate holder is therefore likewise brought to the same potential as the substrate guide, preferably to ground potential (earth). The parameters such as bias voltage, velocity of the positive plasma ions, etc. can be set, by means of the frequency of the switchable current path which is formed via the electrical outgoing line, in such a way that a particularly good cleaning action is produced according to the particular product used.

The product is preferably a component of a thermal machine, in particular of a gas turbine, such as a stationary gas turbine used in the power plant sector or a component of an aircraft engine turbine. The product may in this case be designed as a heat shield of a combustion chamber or as a turbine blade, a turbine rotor blade or a turbine guide vane.

In accordance with a further feature of the invention, the protective layer, in particular the thermal barrier coating, is a ceramic layer. It may include zirconium oxide ($ZrO_2$) or another ceramic material which is suitable for use at high temperatures, in particular a metal oxide. A zirconium oxide is preferably partially or completely stabilized with yttrium oxide ($Y_2O_3$) or another oxide of a rare earth element.

In accordance with yet a further feature of the invention, the base body is a metallic substrate. Nickel-base and/or cobalt-base alloys such as those which are described, for example, in U.S. Pat. No. 4,405,659, inter alia, are particularly suitable for applications at high temperatures with corresponding demands imposed on resistance to corrosion.

An adhesion promoter layer is arranged between base body and thermal barrier coating. This adhesion promoter layer may consist of an alloy of iron, cobalt and/or nickel with chromium, aluminum, yttrium. Instead of, or in addition to yttrium, one of the elements from group IIIb of the periodic system, including the actinides and the lanthanides and, in addition, or as an alternative, rhenium may be included. Yttrium-containing alloys of this type are described in the literature under the designation "MCrAlY" alloy. Alloys which contain significantly more rhenium than yttrium may be referred to as "MCrAlRe" alloys. An oxide layer, in particular a layer of aluminum oxide, chromium oxide and/or gallium oxide, may be provided between the adhesion promoter layer and the thermal barrier coating. An oxide layer of this type may already have been applied as an oxide or may form over the course of time as a result of subsequent oxidation (thermally grown oxide, TGO).

Other features which are considered as characteristic for the invention are set forth in the appended claims.

Although the invention is illustrated and described herein as embodied in a device for cleaning an article, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
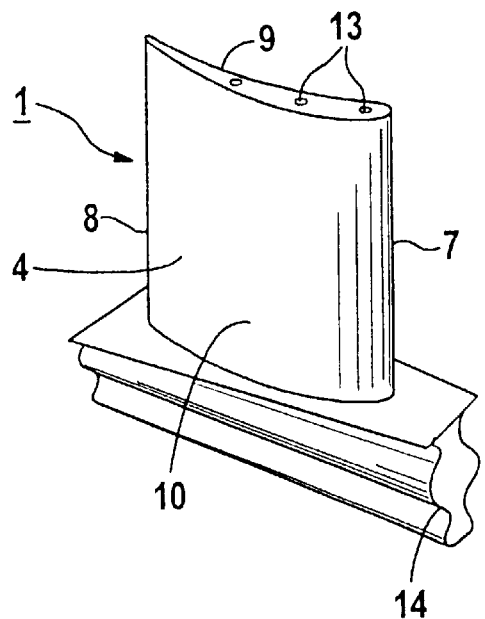
FIG. 1 is a perspective view of a turbine rotor blade.

Referring now to the figures of the drawing in detail and first, particularly, to FIG. 1 thereof, there is seen, as a representative of the article of manufacture 1, a rotor blade of a turbine, in particular of a gas turbine. The rotor blade 1, which is made from iron, cobalt and/or nickel, has a blade root 14, by means of which it can be secured in a non-illustrated rotatable turbine shaft. The blade root 14 is adjoined by the actual blade root region, which extends from a leading edge 7 to a trailing edge 8 via a pressure side 9 on one side, and a suction side 10 on the other side. Cooling channels 13 for carrying a cooling medium, in particular cooling air, are provided in the actual blade region. The blade region has a surface 4 with differently curved surface regions.

Figure 2:
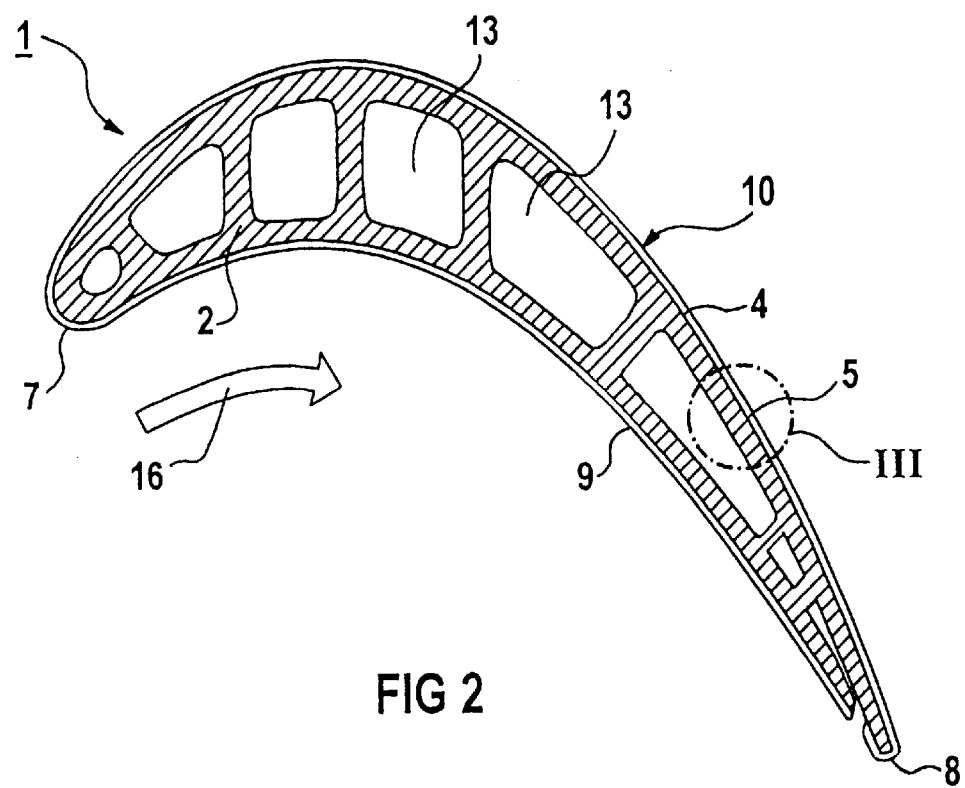
FIG. 2 is a cross section through a turbine blade.

FIG. 2 illustrates a cross section through a gas-turbine blade—again representing the article of manufacture—around which a hot gas flows 16 during its use in a gas turbine. In cross section, the turbine blade 1 extends from a leading edge 7, via a pressure side 9 and a suction side 10, to a trailing edge 8. The turbine blade 1 is formed from a substrate or base body 2, in the interior of which a plurality of cooling channels 13 for carrying cooling air are provided. The entire surface 4 of the turbine blade 1 is coated with a thermal barrier coating 5.

Figure 3:
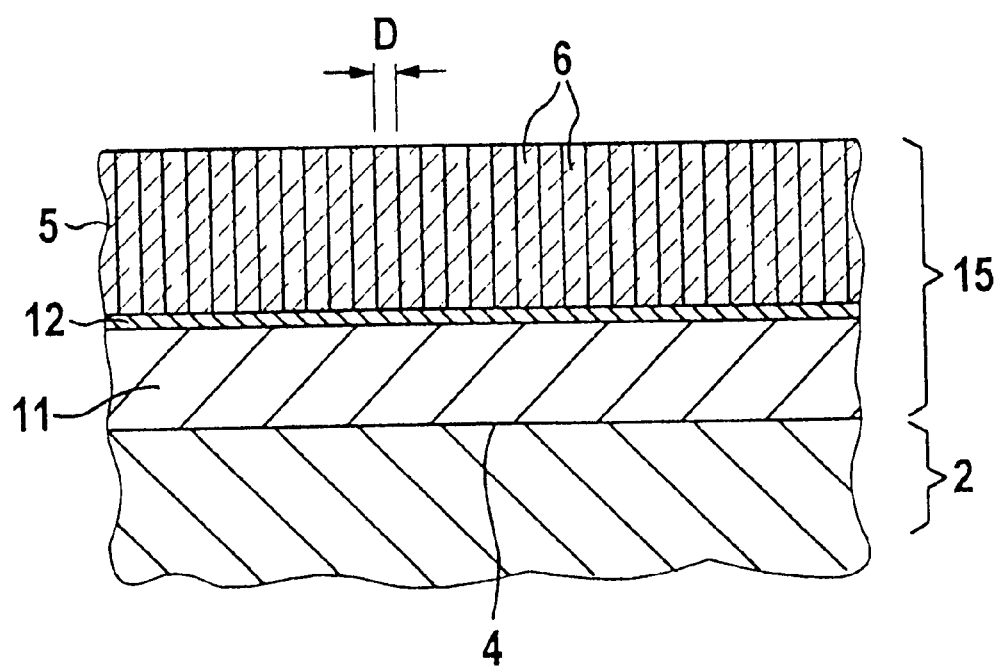
FIG. 3 is a partial sectional view of a thermal barrier coating system of the turbine blade of FIG. 2.

FIG. 3 diagrammatically depicts the structure of a thermal barrier coating system 15. The thermal barrier coating system 15 is applied to the base body 2. Directly adjacent to the base body 2, it has an adhesion promoter layer 11, which is adjoined by an oxide layer 12 and the actual thermal barrier coating 5, which is on top of the oxide layer 12. The adhesion promoter layer 11 may be a known alloy of the type MCrAlY or MCrAlRe. The oxide layer 12 may substantially comprise an aluminum oxide or may alternatively or additionally include metal oxides, such as chromium oxide or gallium oxide. The choice of adhesion promoter layer 11 and of oxide layer 12 naturally depends on the material of the base body 2 and on the thermal barrier coating 5 to be applied. The latter may, for example, consist of partially stabilized zirconium oxide. The thermal barrier coating 5 has a fine structure with ceramic columns 6 which are oriented substantially perpendicular to the surface 4 of the base body 2. The ceramic columns 6 each have a mean column diameter D which, for a layer thickness of the thermal barrier coating 5 of approximately 100 $\mu$m to 200 $\mu$m, lies in the range between 0.5 and 5 $\mu$m, preferably below 2.5 $\mu$m.

Figure 4:
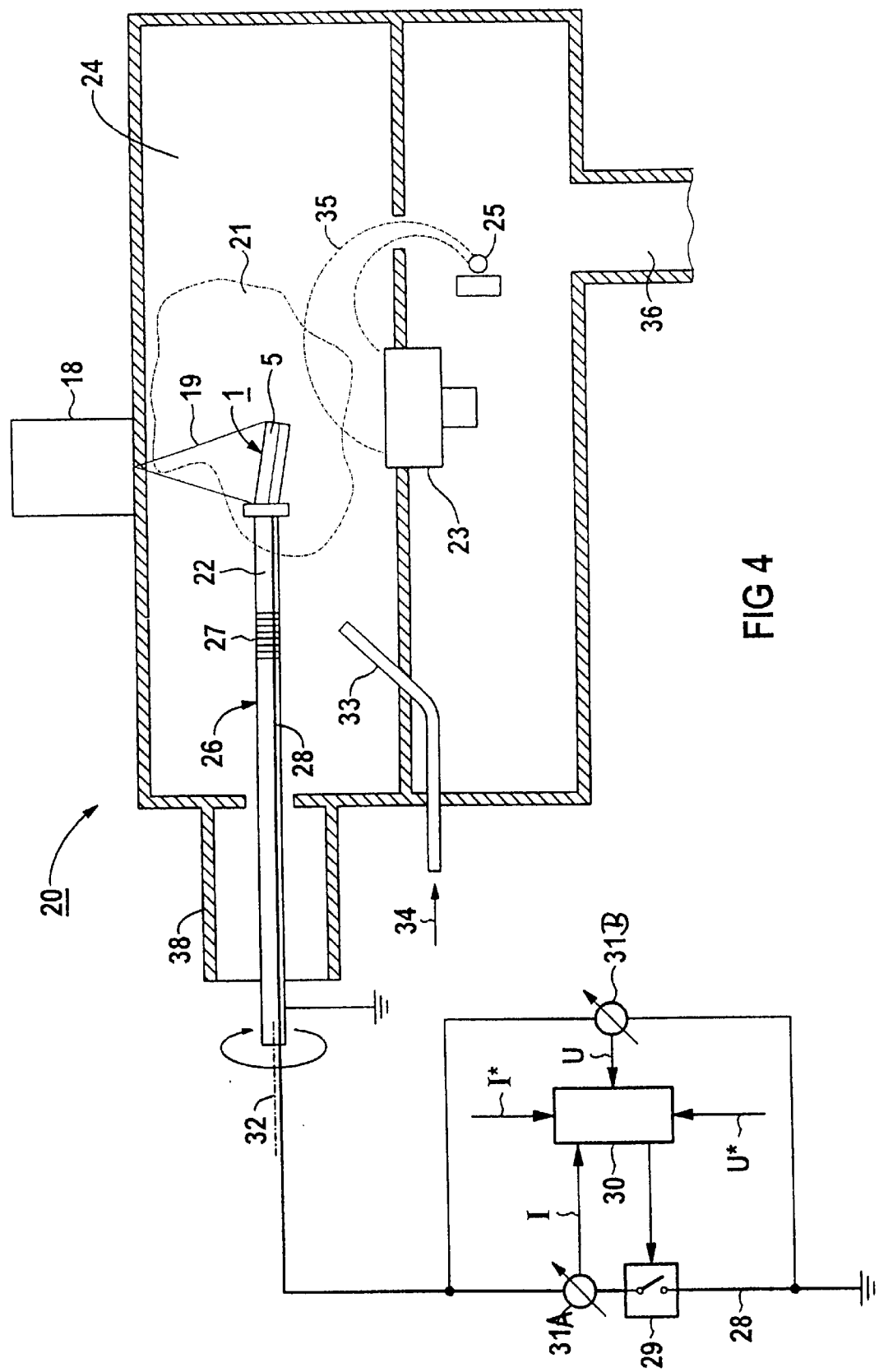
FIG. 4 is a diagrammatic section through a coating installation for coating a turbine blade with thermal barrier coating.

FIG. 4 shows a diagrammatic longitudinal section through a device 20 for cleaning a article 1, which is integrated in a coating device for applying a thermal barrier coating 5 to the article 1, in particular to a gas turbine blade. The device 20 has a substrate chamber 24, which serves as a coating chamber. A suitable sub-atmospheric pressure (vacuum) can be established in the chamber 24, and a gas, in particular an inert gas, is introduced. Pumps, which are not shown and to which the substrate chamber 24 is connected via a pump outlet 36, are provided for the purpose of evacuating the chamber 24 and to build the vacuum in the chamber 24. A substrate guide 26, which extends along an axis of rotation 32 and is designed, for example, as a hollow cylindrical tube, is introduced into the substrate chamber 24 via an introduction chamber 38. The substrate guide 26 is adjoined by a substrate holder 22 which is mechanically fixedly connected to the substrate guide. The article 1 is held rotatably, and optionally also pivotably, in the substrate holder 22. The substrate guide 26 is electrically insulated from the substrate holder 22 by insulation 27. The substrate guide 26 is grounded outside the substrate chamber 24.

The substrate holder 22 is connected to an electrical outgoing line 28 which, for example, is guided through the substrate guide 26. A measuring device 31A, 31B, in particular a current-measuring device 31A for measuring an electric current I and a voltage-measuring device 31B for measuring an electrical bias voltage U, is arranged in the electrical outgoing line 28. Furthermore, a switch 29, which can be controlled by a control device 30, is provided in the outgoing line 28. The switch 29 may be designed as a mechanical or electronic switch or as a suitable control mechanism. Its essential function is that of controlling the electric current I flowing through the outgoing line 28. The outgoing line 28 is also connected, outside the substrate chamber 24, to a reference potential, which may be frame or ground. The switch 29 and the measuring devices 31A, 31B are connected to a control device 30, by means of which the switch 29 can be controlled, so that the switch 29 opens and closes at a frequency which can be preset by means of the control device 30. The frequency or on/off duration (duty factor) used for the opening and closing may be effected as a function of the bias voltage U determined by means of the measuring device 31A, 31B. The frequency may also be fixed by means of a desired current value I* and/or a desired voltage value U*, the desired current value I* and/or the desired voltage value U* being input into the control device 30 and being compared to the actual values U, I in the control device 30. The control signals for the switch 29 are passed from the control device 30 to the switch 29.

An electron beam gun 18, which generates an electron beam 19, is provided on the substrate chamber 24, above the substrate holder 22. The electron beam 19 may, in this case, as shown, be of fan-shaped or cone-shaped design as an electron beam fan or electron beam cone. Using the grounding of the substrate guide 26 and the controllable grounding (reference potential) of the substrate holder 22, the electron beam 19 is guided toward the article 1. On the way to the article 1, the electron beam 19 causes the gas situated in the substrate chamber 24, for example, an inert gas such as argon, to be ionized. As a result, a plasma 21 is formed in the vicinity of the article 1. The electrons which come into contact with the article 1 from the electron beam 19 are discharged via the outgoing line 28 when the switch 29 is closed.

When the switch 29 is open, there is a build-up of electrons in front of the article 1, i.e. a negatively charged cloud of electrons around the article 1, with the result that the positively charged ions of the plasma 21 are accelerated toward the article 1. The positive ions which have been accelerated in this way come into contact with the article 1 and thus cause contaminants on the article 1 to be removed.

The constant change between an open and closed state of the switch 29 therefore leads to a frequency-dependent alternating charging and discharging of the article 1, so that an alternating voltage discharge (plasma formation) is ignited or maintained. This allows continuous cleaning of the article 1, and surface activation prior to a coating operation. High frequency switching is preferably established via the switch 29 and the control device 30 in such a manner that a cleaning action which is independent of the geometry of the article 1 is achieved. This leads to particularly effective and homogeneous surface cleaning.

A coating target 23, for example made from zirconium or zirconium oxide, is arranged in the substrate chamber 24, which at the same time represents the coating chamber of a coating installation, at a lower level than the article 1. A further electron beam gun 25 for generating a further electron beam 35 is provided in the substrate chamber 24. To carry out the actual coating of the article 1, the substrate chamber 24 has a feed 33 for an oxygen-containing gas 34, so that additional oxidation for a metal-ceramic thermal barrier coating can be achieved. The article 1 is, for example, a gas turbine blade or a heat shield element with a protective layer, in particular with a thermal barrier coating made from a ceramic. The coating target 23 is grounded during the actual coating operation. The electron beam 35 is diverted toward the coating target 23 (as shown in dashed lines), and then comes into contact with the coating target 23, where it causes the material of the coating target 23, in particular zirconium or zirconium oxide, to be vaporized. The material which has been vaporized in this way flows toward the article 1, where it is deposited, if appropriate with simultaneous oxidation, as a protective layer (thermal barrier coating). The article 1 is in the process rotated about the axis of rotation 32 as a result of the entire substrate guide 26 being rotated about the axis of rotation 32 by means of a non-illustrated motor. The rotation of the article 1 about the axis of rotation 32 is also effected during the cleaning operation by means of plasma ions. The plasma discharge and therefore the ion firing of the substrate 1 can also be maintained during the coating, so that interim cleaning is achieved.

In the example illustrated, the entire coating process can be carried out in the substrate chamber 24. Preferably, in a first process step, the article 1 is heated, without the presence of a gas which forms a plasma 21, by means of an electron beam 19 to a temperature which lies above the actual coating temperature. This advantageously leads to prior thermal cleaning on account of the vaporization/gasification of contaminants. In a second process step, in which gas which forms the plasma 21 is now present, renewed firing using the electron beam 19 takes place, with the result that simultaneous cleaning of the article 1 by means of the plasma 21 and heating of the article 1 by means of the electron beam 19 are achieved. On account of the prior thermal cleaning, this final cleaning by means of ion firing (sputtering) can be carried out significantly more quickly and more effectively. After the cleaning of the article 1 has ended, this product has been heated to the coating temperature, and electrons are fired on to the coating target 23, with the result that the protective layer 5, in particular a thermal barrier coating, is applied to the article 1. The cleaning of the article 1 by means of the plasma 21 renders the adhesion of the thermal barrier coating to the article 1 particularly superior.

I claim:

1. A device for cleaning an article, comprising:

a housing defining a substrate chamber;

a substrate guide disposed in said substrate chamber;

a substrate holder for holding an article connected to said substrate guide in a mechanically fixed and electrically insulated manner;

an electrical outgoing line connected to said substrate holder, and a switch connected in said electrical outgoing line for selectively connecting said substrate holder to a reference potential; and an electron beam gun for generating an electron beam directed onto the article.

2. The device according to claim 1, wherein said substrate holder is configured to hold a component of a gas turbine.

3. The device according to claim 1, which further comprises a control device connected to said switch for controlling an alternating opening and closing of said switch.

4. The device according to claim 1, which further comprises a measuring device connected to said outgoing line for measuring one of a current and a voltage.

5. The device according to claim 4, which further comprises a control device connected to said switch for controlling an alternating opening and closing of said switch, and a measuring device connected to said outgoing line and to said control device for measuring one of a current and a voltage.

6. The device according to claim 1, which comprises a regulator connected to said switch, said regulator being preset to a desired value for regulating a switching frequency of said switch.

7. The device according to claim 1, further comprising insulation between said substrate holder and said substrate guide.

* * * * *